(12) United States Patent
Chen

(10) Patent No.: US 6,798,659 B2
(45) Date of Patent: Sep. 28, 2004

(54) CPU COOLING STRUCTURE

(76) Inventor: Wilson Chen, 4F, No. 3, Alley 9, Lane 45, Pao-Hsin Rd., Hsin Tien, Taipei (TW)

(*) Notice: Subject to any disclaimer, the term of this patent is extended or adjusted under 35 U.S.C. 154(b) by 84 days.

(21) Appl. No.: 10/369,701

(22) Filed: Feb. 21, 2003

(65) Prior Publication Data
US 2004/0165355 A1 Aug. 26, 2004

(51) Int. Cl.$^7$ .............................................. H05K 7/20
(52) U.S. Cl. ...................... 361/697; 62/3.2; 62/3.7; 62/259.2; 361/704; 361/710; 165/80.3; 165/185; 165/121
(58) Field of Search .................... 62/3.2, 3.7, 259.2; 165/80.2, 80.3, 185, 121; 361/687–721

(56) References Cited

U.S. PATENT DOCUMENTS

| | | | | |
|---|---|---|---|---|
| 5,419,780 A | * | 5/1995 | Suski | 136/205 |
| 5,456,081 A | * | 10/1995 | Chrysler et al. | 62/3.7 |
| 5,457,342 A | * | 10/1995 | Herbst, II | 257/712 |
| 5,655,375 A | * | 8/1997 | Ju | 62/3.6 |
| 5,676,199 A | * | 10/1997 | Lee | 165/80.3 |
| 6,094,919 A | * | 8/2000 | Bhatia | 62/3.7 |
| 6,324,058 B1 | * | 11/2001 | Hsiao | 361/699 |
| 6,424,533 B1 | * | 7/2002 | Chu et al. | 361/719 |

* cited by examiner

Primary Examiner—Gregory D. Thompson
(74) Attorney, Agent, or Firm—Rosenberg, Klein & Lee

(57) ABSTRACT

A CPU cooling structure is constructed having a thermo-electric cooling panel installed in a heat sink and controlled by a control circuit to cool the CPU to which the heat sink is fastened.

1 Claim, 4 Drawing Sheets

CPU COOLING STRUCTURE

BACKGROUND OF THE INVENTION

1. Field of the Invention

The present invention relates to a cooling structure for cooling a CPU or the like and, more particularly, to such a CPU cooling structure, which uses a thermoelectric cooling panel to enhance the cooling effect.

2. Description of the Related Art

FIG. 1 illustrates a CPU cooling structure constructed according to the prior art. According to this design, the CPU cooling structure comprises a heat sink 20', the heat sink 20' having a flat bottom contact wall 23' adapted to absorb heat from the CPU to be cooled, a fan 10' mounted on the top side of the heat sink 20' and adapted to induce currents of air through gaps in the heat sink 20', and a power cable 30' electrically connected to the fan 10' and adapted to obtain power supply from the host computer containing the CPU. The cooling efficiency of this design of CPU cooling structure is low. When the CPU continuously running for a long time, the heat sink 20' and the fan 10' cannot effectively lower the temperature of the CPU. When the ambient temperature is excessively high, the CPU will break down.

SUMMARY OF THE INVENTION

The present invention has been accomplished under the circumstances in view. It is therefore the main object of the present invention to provide a CPU cooling structure, which achieves a high cooling performance. It is another object of the present invention to provide a CPU cooling structure, which uses a thermoelectric cooling panel to enhance the cooling effect. IT is still another object of the present invention to provide a CPU cooling structure, which can be used in a computer, machinery, or any of a variety of electric and electronic apparatus that use a CPU for operation control. According to the present invention, the CPU cooling structure comprises a heat sink, a fan mounted on the top side of the heat sink, a thermoelectric cooling panel mounted in the bottom side of the heat sink in a flash manner, a metal contact plate bonded to the bottom side of the heat sink to seal the thermoelectric cooling panel and adapted to contact the CPU to be cooled, and a control circuit adapted to control the operation of the fan and the thermoelectric cooling panel.

DETAILED DESCRIPTION OF THE PREFERRED EMBODIMENT

Figure 1:
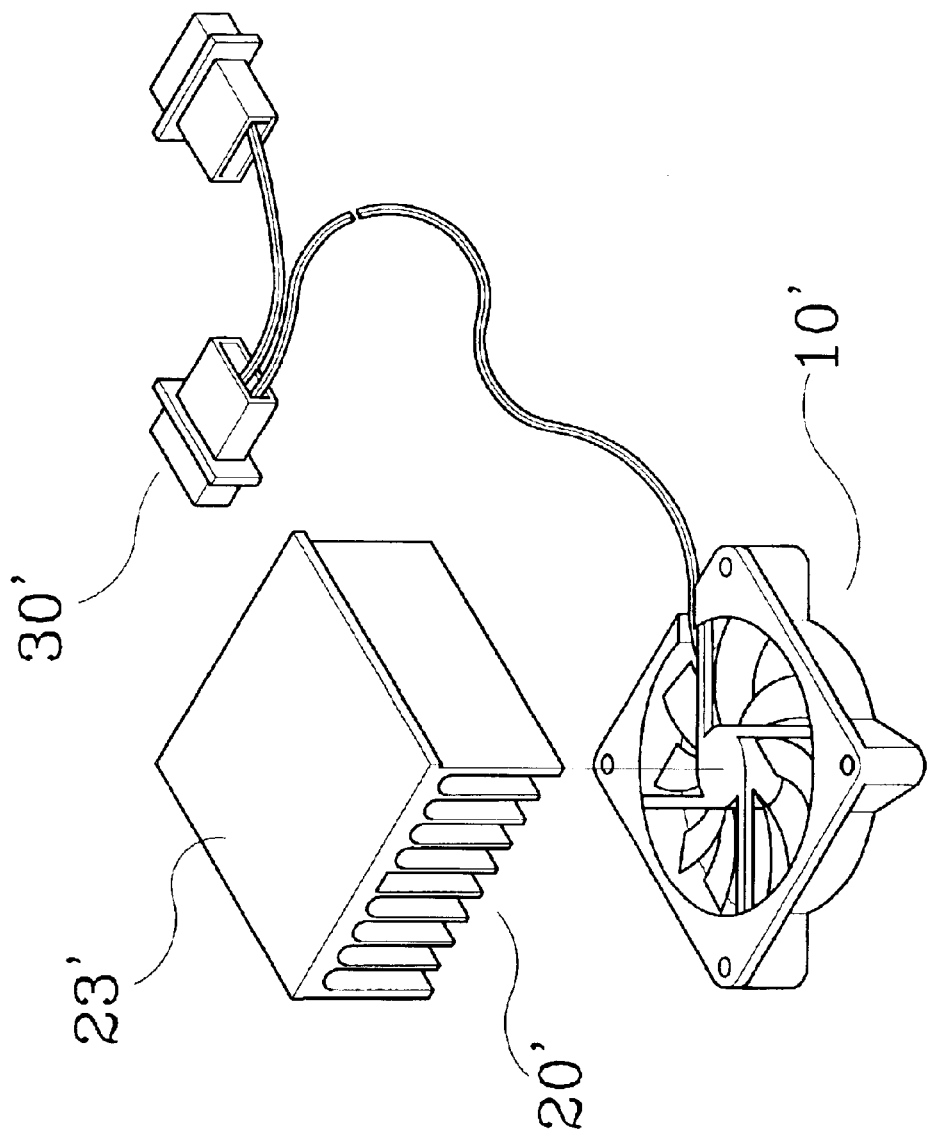
FIG. 1 is an exploded view of a CPU cooling structure according to the prior art.
Figure 2:
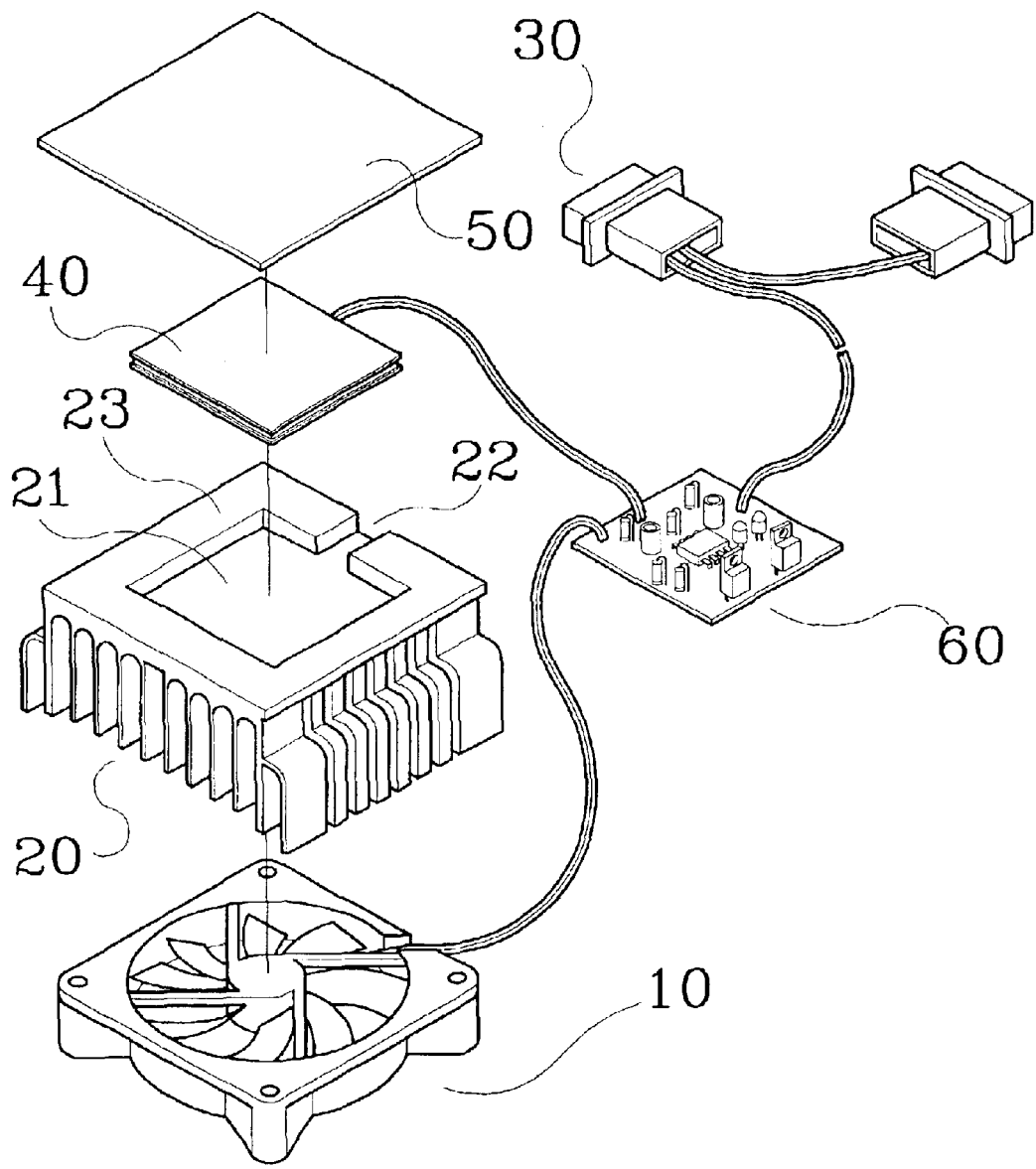
FIG. 2 is an exploded view of a CPU cooling structure according to the present invention.
Figure 3:
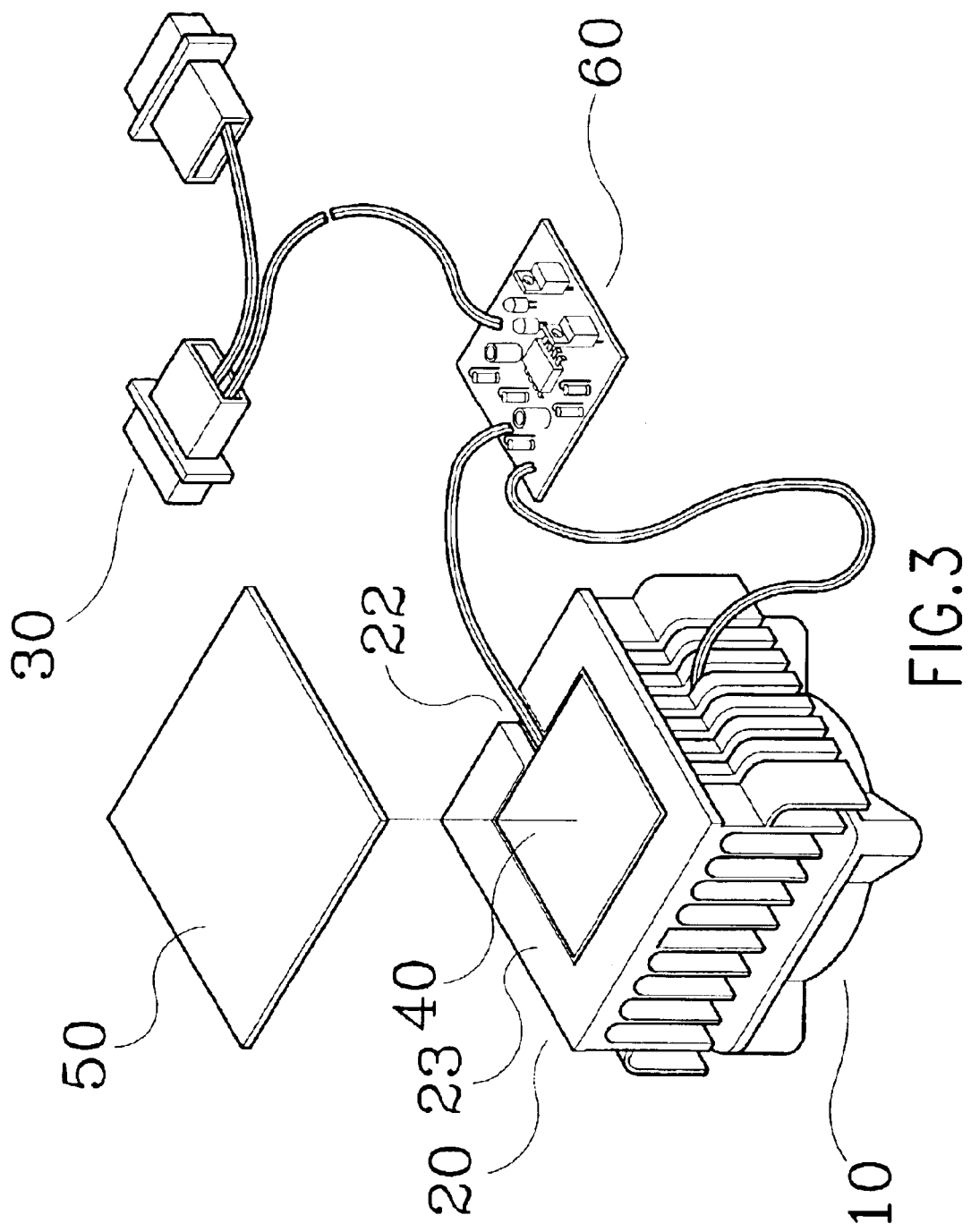
FIG. 3 is similar to FIG. 2 but showing the thermoelectric cooling panel fitted into the flat recess of the heat sink.
Figure 4:
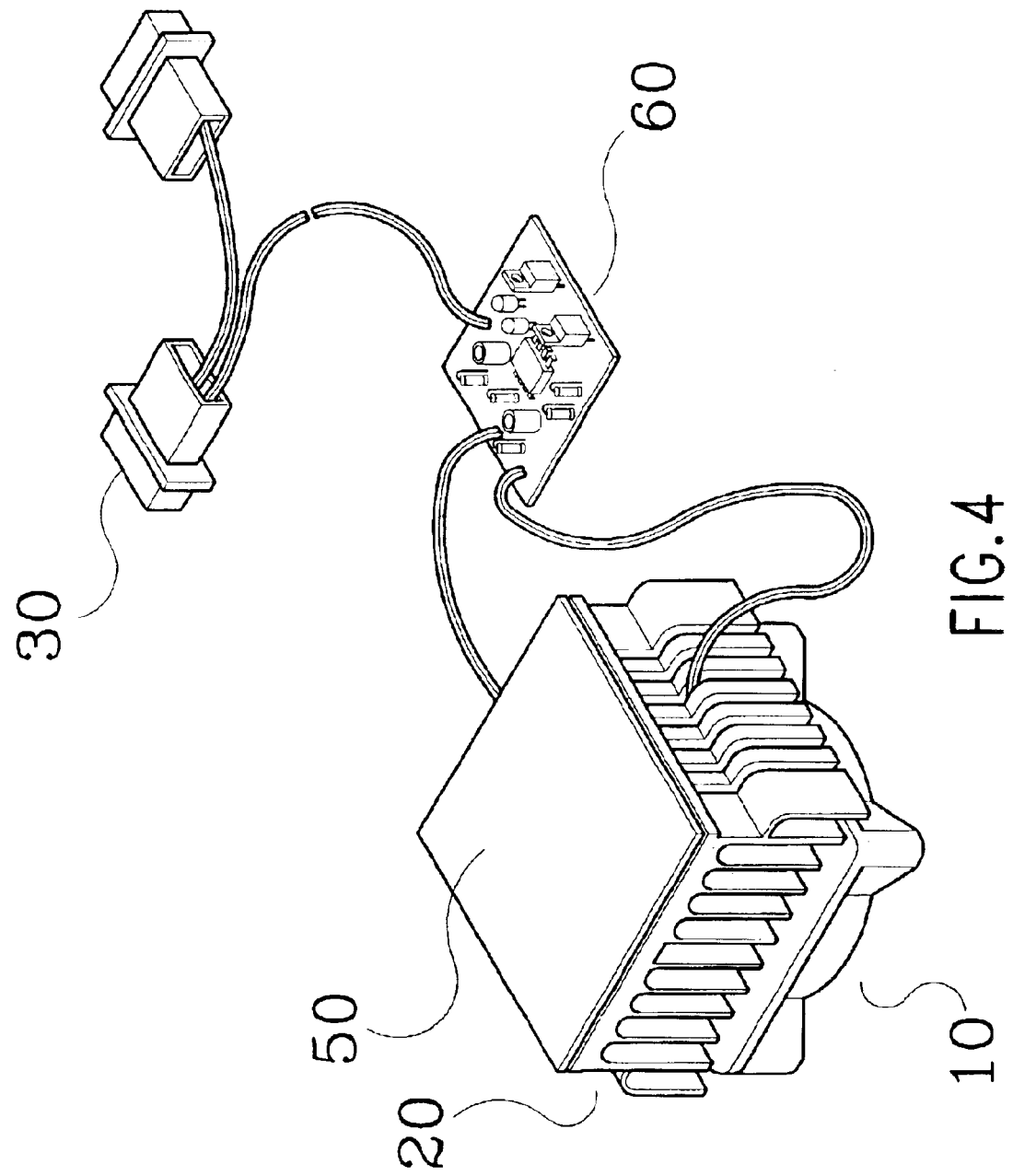
FIG. 4 is an elevational view of the present invention, showing the CPU cooling structure assembled.

Referring to FIGS. 2~4, a CPU cooling structure in accordance with the present invention is shown comprised of a fan 10, a heat sink 20 of aluminum alloy, a thermoelectric cooling panel 40, a metal contact plate 50, a power cable 30, and a control circuit 60. The fan 10 is fixedly fastened to the top side of the heat sink 20. The heat sink 20 has a flat bottom wall 23, a flat recess 21 in the flat bottom wall 23, and a groove 22 extended from the flat recess 21 to the periphery of the flat bottom wall 23. The thermoelectric cooling panel 40 is fitted into the flat recess 21 and maintained in flush with the flat bottom wall 23 of the heat sink 20, enabling the electric wire to extend to the outside of the heat sink 20 through the wire groove 22. The metal contact plate 50 is bonded to the flat bottom wall 23 of the heat sink 20 to seal the thermoelectric cooling panel 40. The electric wires of the fan 10 and the thermoelectric cooling panel 40 are respectively connected to the control circuit 60. The power cable 30 is electrically connected to the control circuit 60 and adapted to obtain power supply from the host computer in which the CPU cooling structure is installed.

When in use, the metal contact plate 50 is maintained in close contact with the CPU (not shown) to transfer cold temperature from the cold side of the thermoelectric cooling panel 40 to the CPU to lower the temperature of the CPU during the operation of the CPU. At the same time, hot temperature from the hot side of the thermoelectric cooling panel 40 is absorbed by the heat sink 20 and carried away from the heat sink 20 by currents of air induced by the fan 10. Further, the control circuit 60 controls the operation of the thermoelectric cooling panel 40 subject to the level of the ambient temperature detected by a temperature sensor (not shown) of the control circuit 60, i.e., when the ambient temperature surpassed a predetermined level, the control circuit 60 turns on the thermoelectric cooling panel 40 to enhance the cooling effect; when the ambient temperature dropped below a predetermined level, the control circuit 60 turns off the thermoelectric cooling panel 40.

A prototype of CPU cooling structure has been constructed with the features of FIGS. 2~4. The CPU cooling structure functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A CPU cooling structure of the type comprising a heat sink adapted to absorb heat from a CPU of a host computer and a fan adapted to dissipate heat from said heat sink, wherein said heat sink has a flat recess in a flat bottom wall thereof, a thermoelectric cooling panel fitted into said flat recess, and a metal contact plate bonded to said flat bottom wall to seal said thermoelectric cooling panel and adapted to contact the CPU to be cooled; a control circuit is electrically connected to said fan and said thermoelectric cooling panel and adapted to control the operation of said fan and said thermoelectric cooling panel, said control circuit having a power cable for connecting to power circuit means of the host computer in which the CPU cooling structure is installed to obtain power supply from the host computer for said fan and said thermoelectric cooling panel.

* * * * *